United States Patent [19]

Kobayashi et al.

[11] 4,205,098
[45] May 27, 1980

[54] SELENIUM PELLETS FOR USE IN VACUUM-DEPOSITION AND METHOD OF PRODUCING SUCH PELLETS

[75] Inventors: Shuji Kobayashi, Inagi; Mitsuo Aoyagi, Hadano; Tominori Kanno, Hadano; Kazuei Ueno, Hadano; Shin-ichi Nomura, Hadano, all of Japan

[73] Assignee: Stanley Electric Co., Ltd., Tokyo, Japan

[21] Appl. No.: 952,217

[22] Filed: Oct. 17, 1978

[30] Foreign Application Priority Data

Oct. 18, 1977 [JP] Japan .................................. 52-124020

[51] Int. Cl.² ...................... C23C 13/00; G03G 5/082
[52] U.S. Cl. ......................................... 427/76; 75/228; 264/15; 264/125; 423/510; 427/83; 427/248.1
[58] Field of Search .................. 427/83, 248 R, 76; 75/228; 264/15, 125; 423/510

[56] References Cited

U.S. PATENT DOCUMENTS

| | | |
|---|---|---|
| 2,662,832 | 12/1953 | Middleton et al. .................. 423/510 |
| 2,822,300 | 2/1958 | Mayer et al. ........................... 427/73 |
| 3,164,892 | 1/1965 | Lieberman et al. ..................... 75/228 |
| 3,973,917 | 8/1976 | Henriksson .......................... 423/510 |
| 4,015,029 | 3/1977 | Elchisak ................................. 427/74 |
| 4,046,565 | 9/1977 | Miller ..................................... 427/83 |
| 4,097,267 | 6/1978 | Baccaro et al. ...................... 423/510 |
| 4,097,273 | 6/1978 | Gunther ............................... 423/510 |
| 4,127,235 | 11/1978 | Klaile et al. ......................... 423/510 |

*Primary Examiner*—John D. Smith
*Attorney, Agent, or Firm*—Cushman, Darby & Cushman

[57] ABSTRACT

Selenium pellets are produced by compacting, under a pressure, a powdery material selected from a group consisting of powdery metallic selenium, and a mixture of powdery metallic selenium and one or more of additives, and by sintering the resulting compact at a temperature not less than 100° C. but lower than the melting point of selenium.

The selenium pellets are used as selenium source material in vacuum-deposition to produce a photoconductive layer having improved photoelectric properties over those obtained by using conventional particulate amorphous selenium as source material.

6 Claims, 1 Drawing Figure

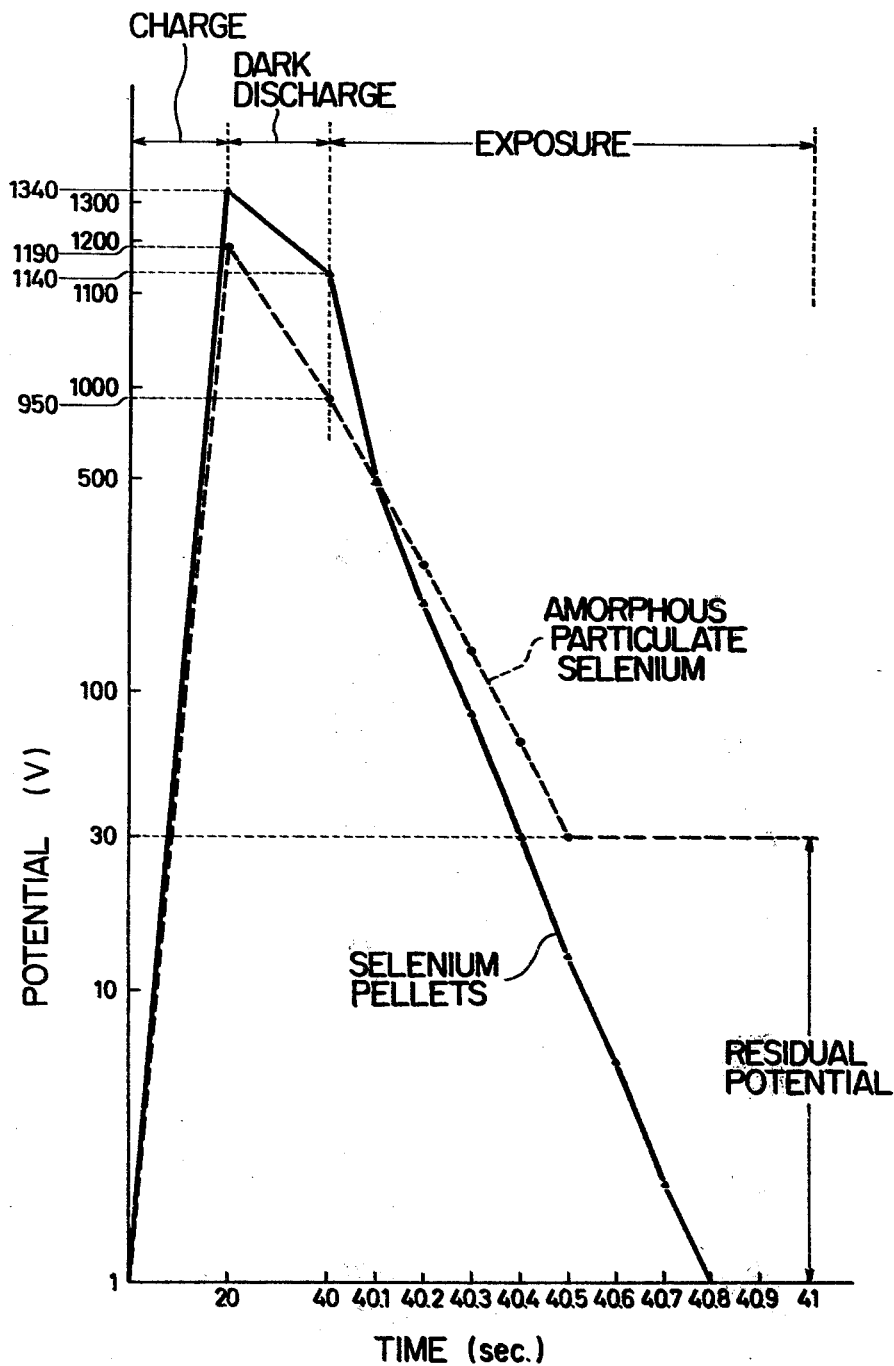

SELENIUM PELLETS FOR USE IN VACUUM-DEPOSITION AND METHOD OF PRODUCING SUCH PELLETS

BACKGROUND OF THE INVENTION (a) Field of the Invention

The present invention relates to a method for depositing selenium alone or a mixture of selenium and a minor amount of additives on an appropriate substrate in vacuum, and also to selenium sources for use in such vacuum-deposition. More particularly, it relates to a method for performing vacuum-deposition, into a film form, of selenium or doped selenium on a support for use in the production of a photoconductive-layer-containing electrostatographic plate, a selenium rectifier and a selenium photocell using a specific selenium source.

(b) Description of the prior art

Generally, selenium metal is produced as a byproduct of copper refining process. More particularly, during the process of refining copper electrolytically, precipitate is formed in an electrolytic cell. This precipitate is roasted and thus selenium dioxide is producted. This selenium dioxide is then dissolved in water to form an aqueous solution thereof. By introducing a reducing agent such as gaseous sulfur dioxide into this solution, fine particles of selenium precipitate on the bottom. This precipitate is removed from the solution and is washed with water, and then dried with heated air. In this way, the powdery metallic selenium is obtained. Though the selenium thus produced has a considerably high purity, its powdery state is inconvenient in handling and apts to cause a loss of selenium due to the tendency to scatter in the ambient air, causing the problem of environmental pollution. To avoid such inconveniences, it has been the practice to melt the powdery selenium and then quickly cool the melt. The resulting amorphous selenium granules have been commercially marketed.

The granules of amorphous selenium have been widely used as a source selenium material in performing vacuum-deposition of selenium. Typically, the particulate amorphous selenium may be produced by melting powdery metallic selenium in a crucible at a temperature of about 300° C., dropping the melt into water through a screen with meshes of about 1 mm to quench and solidify the particles of selenium which have become amorphous and now have a particle size of about 1 mm. Such amorphous selenium, however, has a relatively low purity in most cases, because various contaminants are apt to be introduced in the selenium during the steps of melting and quenching in water which are employed in the production process thereof. Moreover, the particulate amorphous selenium begins to soften when heated at a temperature of about 40° C. or higher, and agglomerates making it difficult to degas the particles. The entrapped gases are released during the subsequent vacuum deposition process, and as a result, the film formed by the deposition tends to have a poor quality. Moreover, in some cases, the gaseous contaminants adsorbed on the selenium particles in the course of the granulating process may burst out from a source containing the selenium during vacuum deposition, resulting in fracture of the surface of a film of selenium deposited. In addition, during the deposition process, the vacuum chamber may be contaminated by the impurities adsorbed on the amorphous selenium. Furthermore, metallic selenium may, to some extent, be evaporated during the melting step of the granulating process, and the dispersed selenium vapor may cause environmental pollution. In this way, the prior art using the particulate amorphous selenium has many inconveniences and disadvantages as to the quality of the film formed by deposition and to environmental sanitation.

SUMMARY OF THE INVENTION

In order to eliminate or greatly reduce the above-mentioned inconveniences and disadvantages encountered in the prior art, there is provided, according to the present invention, a method for performing vacuum-deposition of a film of selenium or doped selenium on an appropriate substrate using specifically prepared selenium mass as a source.

It is, therefore, a primary object of the present invention to provide a method for producing a deposited film having an improved quality over those produced by the conventional techniques of vacuum-deposition of selenium or doped selenium.

Another object of the present invention is to provide selenium mass containing or not containing or not containing a minor amount of additives, which mass is as easy to handle as the particulate amorphous selenium and has a higher purity than that of this later and, moreover, does not cause any problem of environmental pollution during the production process thereof.

Still another object of the present invention is to provide a method for producing, at low cost, selenium mass from metallic selenium powder, which makes it possible to arbitrarily select a desired configuration of mass to be formed depending upon the end use thereof and which can be easily automated through the entire molding process.

BRIEF DESCRIPTION OF THE DRAWING

The drawing is a comparative chart of photoelectric properties of a photoconductive layer which is vacuum-deposited by using, as source, tablets or pellets produced by pelleting powdery metallic selenium according to the method of the present invention and such layer deposited by using conventional particulate amorphous selenium.

DETAILED DESCRIPTION OF THE PREFERRED EMBODIMENTS

It has been found by the inventors that the aforementioned objects can be achieved by using tablets or pellets produced by directly compacting, under a pressure, powdery metallic selenium obtained form a selenium refining process as described hereinbefore. Generally, the use of various kinds of materials in the form of pellet rather than the powdery state is well known in various technical fields. However, selenium in tablet or pellet form has not been commercially available, and moreover it has not till now been taken into consideration to use powdery metallic selenium prepared in the form of tablets in performing vacuum-deposition of selenium. In fact, there has been found no publication reporting a difference in photoelectric properties between a photoconductive layer produced by the use of tablets of powdery selenium and a layer formed by the use of particulate amorphous selenium, in performing vacuum-deposition of selenium, so long as the inventors are aware.

Tablets or pellets of powdery metallic selenium may be produced by using a pelleting machine which may be of any type useful for producing pharmaceutical tablets.

The configuration of a mold in this case may be optionally selected depending upon the end of the tablets. Size of tablets is not critical, and it may vary with either the structure and/or the capacity of a vacuum deposition system to be employed. For selenium vacuum-deposition which is the primary purpose contemplated by the present invention, tablets of a size of about 3 to 10 mm in diameter and about 1 to 3 mm in thickness are conveniently used. Particle size of powdery metallic selenium may be of the order as those of commercially available ones, i.e. about a size passing through a screen of 250 mesh, for example 350 mesh. For an amount of powdery selenium of a given particle size, the relationship between the size of tablets produced by pressing the powder and the molding pressure employed may be expressed generally by a hyperbolic curve. For example, with fine powder containing 90% or more of particles passing through a 350 mesh screen, a tablet having a thickness of 2.5 mm is produced at a molding pressure of 1.0 t/cm$^2$, 2.0 mm at 3.5 t/cm$^2$ and 1.7 mm at 7.0 t/cm$^2$. The molding pressure should be such that the produced tablets will not fracture or collapse during subsequent ordinary handling.

Tablets produced by compacting, under a pressure, a powdery selenium as described above may preferably be sintered at a temperature lower than the melting point of the powdery metallic selenium to increase their mechanical strength as tablets for the purpose of reducing possible fractures or collapse in subsequent handling. Since metallic selenium has a melting point of about 220° C., the sintering temperature should be lower than that, but not lower than about 100° C. which practically is the lower limit of the sintering temperature. Conversely, at a temperature below the lower limit, it becomes difficult to sufficiently increase the mechanical strength of tablets within an economically acceptable length of time. Sintering time can be shorter as the sintering temperature is elevated, and vice versa. For example, when tablets are tested as to compression force applied to the tablets in the radius direction thereof by means of a fractural strength measuring device commercially available from Okada Seiko Co. (Japan) under the name of Speed Checker, tablets having a non-sintered pellet strength of 2.43 kg/cm$^2$ shows a strength of 16.33 kg/cm$^2$ after sintering at a temperature of 210° C. for 20 minutes, 17.87 kg/cm$^2$ at the end of 40 minutes, and 20.03 kg/cm$^2$ at the end of one hour, as contrasted to sintering at a lower temperature i.e. 2.57 kg/cm$^2$ by sintering at 100° C. for one hour, 3.09 kg/cm$^2$ for 2 hours and 3.47 kg/cm$^2$ for 4 hours. Thus, the sintering time which is required for obtaining a certain level of strength will increase with a decrease in the sintering temperature employed.

As the above-said singering intended for increasing the mechanical strength of tablets is carried out at a temperature lower than the melting point of metallic selenium, it will be appreciated that, though a slight fusion may take place at grain boundaries if sintering is performed at a temperature near the melting point of metallic selenium, it may be safely considered that no substantial growth of amorphous selenium is developed if the whole tablets which are sintered are taken into consideration.

The sintering of tablets has the effects that the mechanical strength of tablets is increased, as well as the effect that the water vapor and other gaseous contaminants which have been adsorbed thereto are removed. This removal of gaseous contaminants can be conducted more effectively as the sintering time is prolonged and a further desirable result is obtained when the sintering is carried out under vacuous condition. In case sintering is performed at the lower limit of the above-mentioned temperature range, the increase in the mechanical strength of the resulting tablets is not prominent. Nevertheless, a satisfactory result can be expected in the removal of the adsorbed water molecules or gaseous contaminants from the tablets.

As a result of the above-said removal of water molecules or other gases which have been adsorbed to the tablets, the purity thereof is improved so as to be more fitted for use as a source material of vacuum-deposition, and thus the sintered tablets contribute to enhancement of the quality of the deposited film. In contrast thereto, conventional amorphous particulate selenium not only tends to contain various contaminants, but also is difficult to remove the adsorbed water vapor or other gases therefrom, so that these contaminants are released during the vacuum evaporation and deposition process, and thus the quality of the deposited film is inevitably lowered.

Moreover, the conventional method of granulating the amorphous selenium involving the melting and quenching steps costs a great deal for these steps, whereas the present method can produce selenium particles at much lower cost because of the simplified process that metallic selenium powder itself is only subjected to compression by a pelleting machine.

Moreover, the conventional method for producing the particulate amorphous selenium requires melting a batch of metallic selenium powder and quenching the melt in water, and these steps make it difficult to conduct the whole process continuously or automatically. According to the method of the present invention which produces granules of selenium by forming tablets, the whole process can be conducted continuously and automatically.

Moreover, the conventional amorphous selenium particles have a large variance in particle size as well as a great variance in quality due to the difficulty of controlling the melting temperature and to the pouring of the melt into water as will be easily appreciated from this conventional process of producing the particles. For this reason, the known method frequently adopts such measure as re-melting those amorphous particles having rejectable sizes. In contrast thereto, according to the method of the present invention, there hardly develop variances in particle size and quality.

To powdery metallic selenium which is to be pelleted, various kinds of additives may be added depending upon the end use of the deposited film. The additives which are prepared in the form of powder may be mixed with the powdery metallic selenium, and the mixture may be pelleted. Alternatively, a small proportion of the powdery metallic selenium may be mixed with additivies and then the mixture may be melted and quickly cooled to solidify. The resulting mass may be pulverized to produce a powder, and this powder may be mixed with a large proportion of powdery metallic selenium, and then pelleted. In such case, the proportions of the total amount of selenium and the amount of additives are selected so as to establish a desired ratio of the content of the additives to the total amount of selenium in the final pellets. For example, in case an amount of Te of 1% or more is to be added, tellurium powder may be mixed with metallic selenium powder by a mixer and then the mixture may be subjected to pelleting. Also, in case a relatively small amount of additive, e.g. less than 1%, is intended to be added, such small amount of additive is melted with a small amount of selenium, and then the melt is quenched to be solidified. The resulting solids may be comminuted, and then be mixed with a large amount of metallic selenium powder. Then the mixture may be pelleted. As the additives to be added to selenium, there are, for example, As, Sb, Bi, Fe, Tl, S, I, F, Cl, Br, B, Ge, PbSe, CuO, Cd, Pb, $BiCl_3$, $SbS_3$, $Bi_2S_3$, Zn, CdSe, FeSe and the like. In case a gaseous additive is to be used, a small amount of selenium may be treated in an atmosphere of the gaseous additive to produce a selenium compound, and this compound may be used as an additive.

The process of the present invention may be applied to produce selenium rectifiers and selenium photocells as well as to photoconductive layers for electrostatic printing.

The present invention will become more apparent by giving reference to the following example. It should be understood, however, that the present invention is not limited to this example.

EXAMPLE

Commercially available powder of metallic selenium containing 90% or more of particles that pass through a 350 mesh screen is compacted under a pressure of 3.5 $t/cm^2$ by means of a pelleting machine, model No. HT-AP-38-S, sold by Hatake Tekkosho, Ltd. (Japan) to produce tablets having a thickness of 2 mm and a diameter of 6 mm. These tablets are sintered and degased at about 210° C. for about 18 minutes. Thereafter, some of the resulting tablets are placed in a vacuum chamber and are evaporated therein to produce a selenium-deposition film on an aluminum substrate. The conditions employed for the vacuum deposition are: a pressure inside the vacuum chamber of $10^{-5}$ Torr or less, an evaporating temperature of about 300° C., an evaporating period of time of about one hour, and a temperature of the substrate of about 60° C. The resulting deposited film is about 50 μm in thickness.

On the other hand, a comparative experiment is conducted by the use of conventional particulate amorphous selenium which is not prepared in the form of tablets, and evaporation-deposition of this selenium is carried out under the same conditions as those mentioned above to produce a deposited film.

Both of these two kinds of deposition films are compared with each other as to photoelectric properties when used as a photoconductive layer for electrostatic printing. After dark discharge, the films are exposed to a light of 1.71 Lux emitted from a tungsten lamp having a color temperature of 2850° C. The results are shown in the appending drawing. In the drawing, the ordinate indicates the charged potentials expressed in logarithm and the abscissa indicates the length of time in second, but it should be noted that, beyond 40 seconds, the length of time is mentioned on an enlarged scale. As will be clearly seen from the drawing, the film deposited from the selenium pellets which are produced by compacting selenium powder according to the present invention has a higher initial potential charged during a given charging time, a smaller dark discharge and a lower residual potential after exposure to light, as compared with those corresponding characteristics of the conventional film. Since a high potential is retained with the film deposited according to the present invention, the rate of decrease of potential due to exposure to light may be controlled by means of filters, and contrasting can be improved, and thus intermediate colors can be distinctly printed.

In case selenium pellets containing additives are used, performance of the deposited film is also improved as equally effectively as described with respect to the above example.

What is claimed is:

1. A method for vacuum-depositing a material selected from a group consisting of selenium alone and selenium containing at least one additive by depositing said material through evaporation thereof in vacuum onto a substrate to produce a deposited selenium film thereon, the improvement wherein a powdery material selected from a group consisting of powdery metallic selenium alone and a mixture of powdery metallic selenium and at least one additive is compacted under pressure to produce tablets, and the tablets are degased by heating the tablets at an elevated temperature below the melting point of metallic selenium, and thereafter the tablets are used as a source material for the vacuum deposition.

2. A method according to claim 1, wherein: said powdery metallic selenium has a particle size passing through a 250 mesh screen.

3. A method according to claim 1, wherein: about 90% or more of said powdery metallic selenium has a particle size passing through a 350 mesh screen.

4. A method according to claim 1, wherein: said additive is selected from a group consisting of As, Sb, Bi, Fe, Tl, S, I, B, Ge, PbSe, CuO, Cd, Pb, $BiCl_3$, $SbS_3$, $Bi_2S_3$, Zn, CdSe, FeSe, F, Cl and Br.

5. A method according to claim 1, wherein: said mixture is produced by: melting a small amount of selenium together with said additive, solidifying the melt by quenching, comminuting the resulting solids, and mixing the resulting powder with a substantial quantity of metallic selenium powder.

6. A method according to claim 1, wherein: said degasing of the pellets is carried out at a temperature in the range not lower than 100° C. but lower than the melting point of selenium.

* * * * *